United States Patent [19]

Schaffer

[11] Patent Number: 4,806,875

[45] Date of Patent: Feb. 21, 1989

[54] PRECISION OPERATIONAL AMPLIFIER

[75] Inventor: Gregory L. Schaffer, Sunnyvale, Calif.

[73] Assignee: Maxim Integrated Products, Sunnyvale, Calif.

[21] Appl. No.: 193,258

[22] Filed: May 11, 1988

[51] Int. Cl.[4] .............................................. H03F 3/45
[52] U.S. Cl. ............................................. 330/9; 330/69; 330/259
[58] Field of Search ................ 330/9, 69, 110, 259, 330/261

[56] References Cited

U.S. PATENT DOCUMENTS

| 4,229,703 | 10/1980 | Bustin | 330/9 X |
| 4,356,450 | 10/1982 | Masuda | 330/9 |
| 4,395,681 | 7/1983 | Hornung et al. | 330/259 |
| 4,490,682 | 12/1984 | Poulo | 330/9 |
| 4,554,511 | 11/1985 | Braun | 330/9 |
| 4,667,153 | 5/1987 | Doyle | 330/9 X |

FOREIGN PATENT DOCUMENTS

| 3330043 | 3/1984 | Fed. Rep. of Germany | 330/259 |
| 0087608 | 6/1982 | Japan | 330/259 |

Primary Examiner—James B. Mullins
Attorney, Agent, or Firm—Blakely, Sokoloff, Taylor & Zafman

[57] ABSTRACT

The precision operational amplifier of the invention has at least two stages, a first input differential stage and a second high gain stage having its input coupled to the output of the first stage. A digital control circuit coupled to the output of the second stage is used to supply a correction signal to the first stage, the correction signal being calculated to compensate for the offset voltage of the first stage. A digital representation of the correction signal is stored so that it may continuously be applied to the first stage, whereby the offset voltage of the first stage is substantially reduced and such reduction can be maintained for long periods of times. In a preferred embodiment, the digital circuit supplies a second independent correction signal to the second stage. That signal is also stored so that it may continuously be applied to the second stage, whereby the offset voltage of the second stage is substantially reduced and that reduction too can be maintained for long periods of time. The circuit of the invention may be contained in a single chip, monolithic integrated circuit.

4 Claims, 1 Drawing Sheet

PRECISION OPERATIONAL AMPLIFIER

BACKGROUND OF THE INVENTION

High precision, low-noise amplifiers are needed where accurate amplification of very low level signals is required. Typical low level applications include thermocouple and strain gauge measurement systems which typically have very low signal levels. The signal to be measured may be in the range of 20-60 millivolts. Often it is desirable to have measurement errors as low as one unit of error in 40,000. This requires signal resolution less than a microvolt.

A major source of amplifier error is in offset voltage. The offset voltage is the voltage difference between the non-inverting and the inverting terminals of the amplifier, required to provide a zero volt output signal. In low cost commercial amplifiers, these offset voltages can be several millivolts. Precision operational amplifiers usually maintain the offset voltage at about 100 microvolts. The best of them can achieve a 10 microvolt offset voltage, and chopper-stabilized operational amplifiers commonly have offset voltages of 5 microvolts or less.

Accordingly, chopper-stabilized amplifiers have been the amplifier of choice for low level, precision gain applications. The offset temperature drift of chopper amplifiers is almost nonexistent making them very desirable. However, these amplifiers have long recovery times from overload, typically operate at low speeds, and have clock and 1/f noise that provide serious drawbacks.

The precision operational amplifier of this invention has all of the advantages of chopper stabilized amplifiers yet virtually eliminates 1/f noise. Moreover, the precision amplifier of this invention recovers quickly from overload and has a respectable bandwidth for amplifying signals of moderate speed. The amplifier uses a novel technique for reducing offset voltage without increasing the noise of the amplifier.

BRIEF DESCRIPTION OF THE INVENTION

Briefly, the precision operational amplifier of the invention includes a first input differential stage and a second high gain stage having its input coupled to the output of the first stage. A digital control circuit coupled to the output of the second stage supplies a correction signal to the first stage, the correction signal being calculated to compensate for the offset voltage of the first stage.

In the prior art, an autozeroing technique has been used to reduce offset voltage. In such prior art techniques, the offset voltage is cancelled by an equal and opposite voltage during a special autozeroing cycle. The correction voltage is stored on a capacitor so that it can be picked up and used as a cancellation voltage during the autozeroing cycle.

These prior art techniques have been difficult to employ in an integrated circuit The storage capacitor for the offset voltage is usually too large to be integrated into the circuit. Therefore an external capacitor must be used which is more costly and requires additional space on the printed circuit board layout. Moreover, since this capacitor is external, it tends to act as an antenna and can easily pick up low level signals that increase the noise of the amplifier. Even more importantly, the voltage on the capacitor decays with time as the charge leaks out into the PC board and through the junctions of the transistors within the amplifier. At high temperature, such leakage can be sufficient to require frequent (once a second or more) autozeroing to keep the external capacitor charged to the correct value.

To overcome these difficulties, the precision amplifier of the invention uses a switching amplifier together with a technique for storing a digital representation of the correction signal so that it may continuously be applied to the first stage to reduce the offset voltage, and the reduction can be maintained for long periods of time. This was not possible where the offset voltage was stored on a capacitor. Switching amplifiers are known in the art. An example was described in the Digest of Technical Papers of the 1981 IEEE International Solid-State Circuits Conference, pp. 60-61.

Even better control may be obtained if the digital correction circuit also supplies a second independent correction signal to the second stage of the amplifier, and that correction signal is also stored so that it may be continuously applied to the second stage, thereby substantially reducing the offset voltage of the second stage and maintaining such reduction for long periods of time.

The correction signal is supplied by a low level digital-to analog converter (DAC). These converters are accurate enough to resolve less than 0.1 microvolt. Accordingly, the offset voltage of the amplifier of this invention can be reduced to the 0.1 microvolt level. Since the autozeroing is done digitally, there is no capacitor leakage problem. The accuracy of the correction signal is limited only by the accuracy of the DAC. DACs are much more stable than capacitors for short periods of time. The use of digital storage makes it necessary to correct the offset voltage much less often, once per minute or less. For some applications using the precision amplifier of this invention, it is only necessary to go through the autozero cycle once an hour.

If desired, the precision amplifier of this invention can also have a third stage of amplification whose input is coupled to the output of the second stage.

Finally, contrary to the prior art circuits using large capacitors, the circuit of this invention can readily be integrated on a single, monolithic IC.

DESCRIPTION OF THE PREFERRED EMBODIMENT

Figure 1:
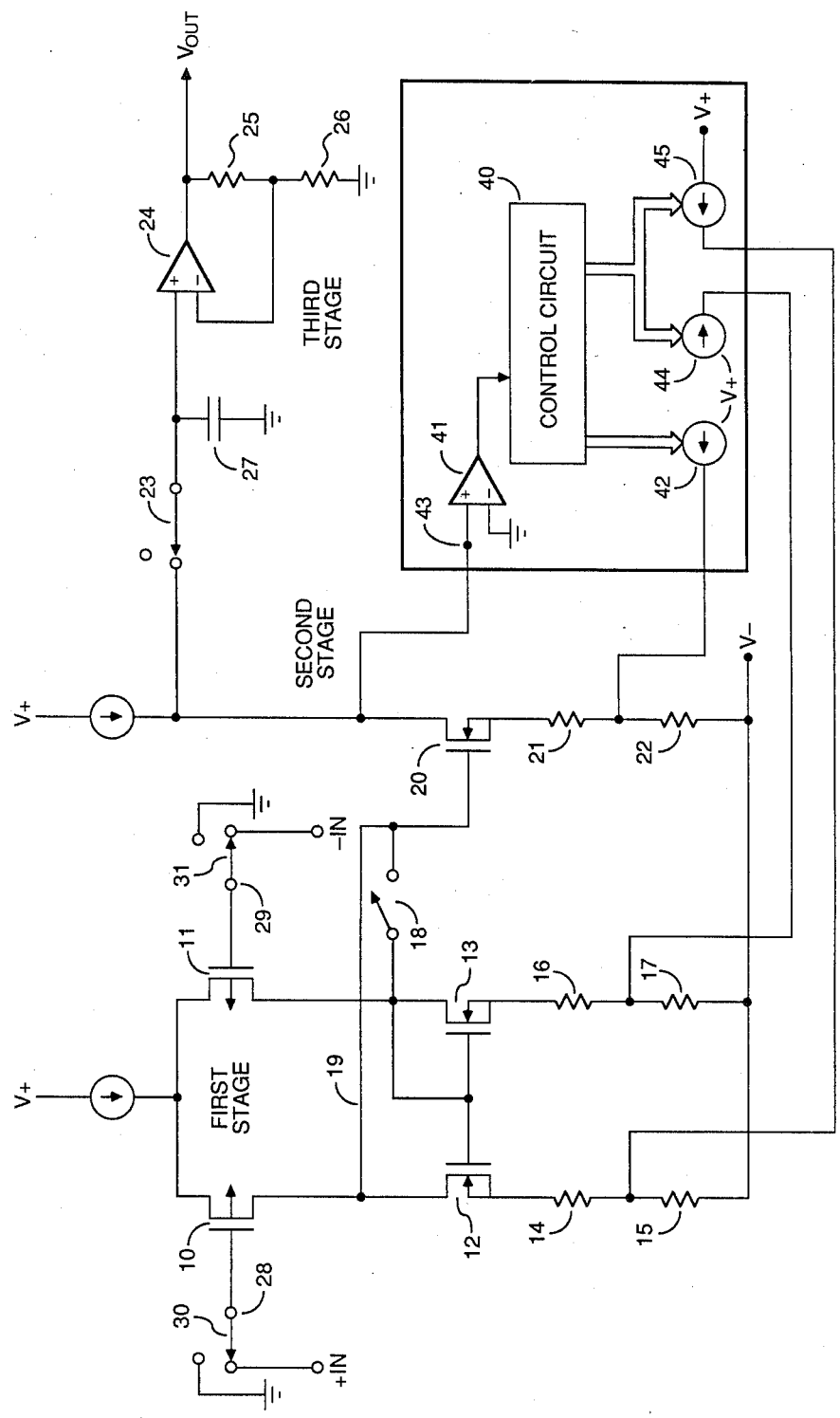
FIG. 1 is a circuit schematic showing the precision operational amplifier of the invention.

Referring to FIG. 1, a three stage switching amplifier is shown with the first, second and third stage identified in the drawing. The first stage is a conventional differential switching amplifier where the plus and minus input voltages are applied to the gates of MOS transistors 10 and 11, respectively, as shown. The first stage also includes MOS transistors 12 and 13, which are the active load transistors of the differential gain stage. The source of transistor 12 is series-coupled through resistors 14 and 15. Resistor 14 is used for making trim adjustments of the amplifier stage, and resistor 15 is part of the DAC. A current from DAC 45 develops a voltage across resistor 15 that effectively cancels the offset voltage. The source of MOS transistor 13 is series-coupled through resistors 16 and 17. When switch 18 is open, the first stage of the precision amplifier of this invention is coupled to the second stage through line 19, one end of which is connected between transistors 10 and 12 of the first stage, and the other end of which is connected to the gate of transistor 20 in the second stage.

The second stage of amplification includes transistor 20 and resistors 21 and 22 which are connected in series with the source of MOS transistor 20. During normal operation, the output of the second stage is connected through switch 23 to the positive input of amplifier 24 in the third stage. The output of amplifier 24 is connected to ground through two series-coupled resistors 25 and 26. The output of the precision amplifier of this invention appears, as shown, at the junction of the output of amplifier 24 and resistor 25. Capacitor 27 is used to help frequency compensate the second stage of amplification during normal operation of the amplifier.

The novel autozeroing technique of this invention will now be explained in detail, referencing FIG. 1. During an autozero cycle, the two inputs 28 and 29 to the first stage of the amplifier are connected to ground through switches 30 and 31, respectively. During the normal operation of the amplifier, these switches are connected to the input signals, +IN and −IN. In addition, during the autozero cycle, switch 23 is open, thereby disconnecting the third stage from the amplifier. Even though it has been disconnected, however, capacitor 27 holds the analog input voltage to amplifier 24 during the autozero cycle. In this way the output voltage $V_{out}$ is maintained during the autozero cycle, which may last on the order of ⅛ of a second.

Both the first and second stages of the amplifier of this invention are autozeroed during the autozero cycle. The second stage is autozeroed first. Switch 18 is closed, thereby shorting the output of the first stage of the amplifier. This makes the second stage, as measured at the gate of transistor 20, insensitive to any first stage gain offset errors.

The autozeroing is controlled by the control circuitry 40. The output signal from the second stage is fed to comparator 41, the output of which is connected to control circuitry 4. The logic in the control circuitry adjusts the current of DAC 42 so as to minimize the voltage at input 43 to comparator 41. This is accomplished in control circuitry 40 using a conventional successive approximation register (SAR). The resolution of DAC 42 need only be 8 bits, sufficient to reduce the offset voltage of the second stage to less than 50 microvolts.

Control circuitry 40 takes the signal from comparator 41 and carries out an analog to digital conversion by successive approximations. The output from control circuitry is a digital code which controls DAC 42 during the autozeroing of the second stage. DAC 42 generates a cancellation voltage sufficient to cancel the offset voltage of the second stage.

After the second stage is autozeroed, the first stage is autozeroed. For autozeroing the first stage, switch 23 remains open and switch 18 is opened. Control circuitry 40 feeds correction signals to DACs 44 and 45, which in turn feed correction signal to the terminals between resistors 16 and 17, and resistors 14 and 15, respectively. These correction currents are carefully measured to cancel the offset voltage error of the first stage. In the preferred embodiment, DACs 44 and 45 are 16 bit DACs with differential outputs, one to each side of the first stage, as shown in FIG. 1. 8 bit DAC 42 alone controls the offset voltage of the second stage. Only 8 bits of control are required because the errors in the second stage have already been reduced by the gain of the first stage. In a preferred embodiment, the sum of the two currents from DACs 44 and 45 is approximately 36 microamps. Because of the high resolution of these DACs, the input referred offset voltage of the first stage can be reduced to about 50 nanovolts. As a practical matter, this exceedingly low offset voltage is comparable to the noise level of the input stage, and as such, is completely adequate offset voltage correction.

During the portion of the autozero cycle where the first stage is autozeroed, offset errors are amplified by both the first and second stages of the amplifier. Consequently, even a 50 nanovolt offset is amplified enough to be detected by comparator 41 which can detect signals as low as 100 microvolts.

At the completion of the autozero cycle, switch 23 is again closed and switches 30 and 31 are opened so that the amplifier inputs to MOS gates 10 and 11 are connected back to the input signals at terminals 28 and 29.

While the invention has been described in connection with its preferred embodiments shown in FIG. 1, those skilled in the art will be capable of making man modifications to this preferred embodiment without departing from the spirit and scope of the invention, as set forth in the claims which follow.

I claim:
1. A precision operational amplifier comprising:
 a first input differential stage;
 a second high gain stage having its input coupled to the output of said first stage;
 a digital control circuit coupled to the output of said second stage, said circuit supplying a first correction signal to said first stage and a second independent correction signal to said second stage, said first and second correction signals to being calculated to compensate for the offset voltages of said first and second stages, respectively;
 means for storing a digital representation of said first and said second correction signals so that they may continuously be applied to said first and second stages, respectively, whereby the offset voltages of said first and second stages are substantially reduced and such reductions can be maintained for long periods of time.
2. The precision operational amplifier of claim 1 having a third stage of amplification whose input is coupled to the output of said second stage.
3. The operational amplifier of claim 1 having all elements in a single monolithic integrated circuit.
4. The precision operational amplifier of claim 1 wherein said digital control circuit applies said second independent correction signal to said second stage before applying said first correction signal to said first stage.

* * * * *